United States Patent [19]
Swirbel et al.

[11] Patent Number: 5,773,198
[45] Date of Patent: Jun. 30, 1998

[54] METHOD OF FORMING HIGH RESOLUTION CIRCUITRY BY DEPOSITING A POLYVINYL ALCOHOL LAYER BENEATH A PHOTOSENSITIVE POLYMER LAYER

[75] Inventors: Thomas J. Swirbel, Davie; Anthony B. Suppelsa; Joaquin Barreto, both of Coral Springs, all of Fla.

[73] Assignee: Motorola, Inc., Schaumburg, Ill.

[21] Appl. No.: 660,384

[22] Filed: Jun. 7, 1996

[51] Int. Cl.[6] ................................... G03C 5/56
[52] U.S. Cl. .................. 430/315; 430/313; 438/678; 438/674; 438/950; 438/951
[58] Field of Search .................. 430/315, 313, 430/311; 438/950, 951, 314, 678, 674

[56] References Cited

U.S. PATENT DOCUMENTS

| | | | |
|---|---|---|---|
| 3,961,961 | 6/1976 | Rich | 430/263 |
| 4,193,849 | 3/1980 | Sato | 204/38 |
| 5,576,147 | 11/1996 | Guckel et al. | 430/313 |

*Primary Examiner*—George F. Lesmes
*Assistant Examiner*—Cheryl Juska
*Attorney, Agent, or Firm*—Dale W. Dorinski

[57] ABSTRACT

A method of forming a high resolution metal pattern on a substrate. A temporary polyvinyl alcohol (10) layer underneath the photoresist layer (20) aids in removing the photoresist layer after plating. The photoresist is photodelineated in conventional manner to form a pattern (40). During photodelineation, the developing process for the resist does not completely remove the PVA (45) that lies directly under the removed resist, but instead reveals those portions of the polyvinyl alcohol layer. The substrate is then rinsed in a hot aqueous solution to effect removal of the revealed PVA portions, now exposing portions (40) of the substrate (15). Metal (50) is then electroplated to build up a metal circuitry pattern. The remaining portions of the photoresist and the PVA are then removed by a hot aqueous solution.

12 Claims, 2 Drawing Sheets

METHOD OF FORMING HIGH RESOLUTION CIRCUITRY BY DEPOSITING A POLYVINYL ALCOHOL LAYER BENEATH A PHOTOSENSITIVE POLYMER LAYER

TECHNICAL FIELD

This invention relates to methods of forming high resolution circuit patterns on a substrate.

BACKGROUND

The relentless drive to miniaturize electronic assemblies has led to the need to create printed circuit boards (PCB) that have conductor lines and spaces of ever diminishing width. When attempting to use conventional techniques of photodelineating and plating the conductors at line widths less than 1.5 mm, a high number of defects appears in the finished PCB because of residual photoresist left on the PCB. This is caused by the closely packed lines that have a thin line of resist between them. During the plating step, the metal tends to pack this thin line of resist tightly, and prevents the resist from being completely washed out during the stripping process. As a result, the residual resist remains behind as a defect, or in the case of the semiadditive process, the resist prevents the complete removal of the underlying metal layer, and thus creates electrical shorts between adjacent conductors. Although one can use a thinner resist, as employed in the semiconductor industry, this limits one to plating conductors of very thin cross section, which is not a desirable condition in many cases. Clearly, a method that would alleviate this problem would be a significant boon to the electronics industry. There is an unfulfilled need to create high density PCBs with lines widths and spaces of less than 1.5 mm and conductor heights of 0.5 mm or more, without a high level of defects from the photoresist process.

DETAILED DESCRIPTION OF THE PREFERRED EMBODIMENT

A method of forming a high resolution metal pattern on a substrate incorporates the use of a temporary polymer layer underneath the photoresist layer. The temporary layer aids in removing the photoresist layer after plating. This method is especially useful when fabricating high resolution lines and spaces, as in a circuitry pattern, where the residual photoresist can become trapped between adjacent conductors and be very hard to remove. The temporary layer under the resist aids in removing the resist after plating. Briefly, a thin layer of a material that can be easily dissolved later, preferably polyvinyl alcohol (PVA), is deposited on the surface of a substrate. A photosensitive polymer layer (photoresist) is deposited on top of the thin polyvinyl alcohol layer. The photoresist is photodelineated in conventional manner to form a pattern. During photodelineation, the developing process for the resist does not completely remove the PVA that lies directly under the removed resist, but instead reveals those portions of the polyvinyl alcohol layer. The substrate is then rinsed in a hot aqueous solution to effect removal of the revealed PVA portions, now exposing portions of the substrate. Metal is then electroplated conventionally into the photodelineated pattern and onto the exposed portions of the substrate to build up a metal circuitry pattern. The remaining portions of the photoresist and the PVA are then removed by a second hot aqueous solution.

In an alternate embodiment of the invention, a metal seed layer is deposited on the substrate before applying the polymer layers, in order to aid adhesion of the electroplated metal to the substrate.

Figure 1:
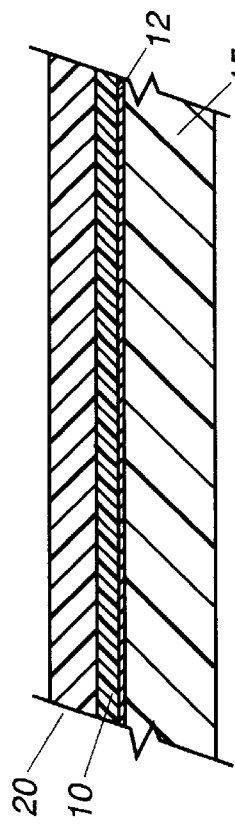
FIG. 1 is a cross-sectional view of a substrate coated with two polymer coatings in accordance with the invention.

While the specification concludes with claims defining the features of the invention that are regarded as novel, it is believed that the invention will be better understood from a consideration of the following description in conjunction with the drawing figures, in which like reference numerals are carried forward. Referring now to FIG. 1, a layer 10 of a polymeric material, preferably a water soluble polymer such as polyvinyl alcohol (PVA), is coated on a substrate 15 surface and dried or partially cured to a condition known to those skilled in the art as B-staged. Prior to coating, the PVA is typically an aqueous suspension or solution. Aqueous PVA solutions are well known to those skilled in the art, and one commercially available solution that finds good use is manufactured by Emulsitone Corporation under the tradename Emulsitone™. The PVA coating may be applied using any number of techniques such as spin coating, roller coating, spraying, or dipping. The solids content of the solution may vary from 5% to 75% by weight depending on the application method and the final thickness desired. A final PVA film thickness in the range of 0.1 micron to 10 microns is typical. A layer of photoreactive polymer 20, is then applied on top of the dried polymeric layer 10. The photoreactive polymer 20 is preferably a liquid photoresist such as AZ4620 manufactured by Hoechst-Celanese and applied by spinning, dipping, or rolling; or it may be a film material such as dry film photoresists manufactured by the DuPont Corporation under the tradename Riston™. After application, the photoreactive material is typically dried or soft baked.

Figure 2:
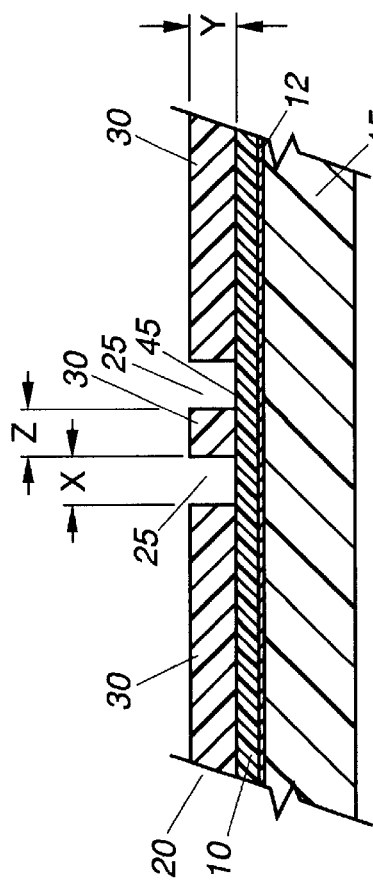
FIG. 2 is a cross-sectional view of the substrate shown in FIG. 1 after photodelineating a pattern in the photosensitive layer, in accordance with the invention.

Referring now to FIG. 2, after the photopolymer layer 20 is applied it is exposed to ultraviolet radiation through a photomask exposing selected areas 25 or 30 in the photopolymer. While the selected regions 25 or 30 may take on any number of configurations, the most desirous configurations to be used with the instant invention are those where the spacing Z between adjacent regions 25 of the pattern is on the order of less than twice the thickness Y of the photoreactive polymer layer 20. In other words, the invention finds greatest advantage in those situations where the width X of the photodelineated pattern is less than or equal to the thickness Y of the resist, and where the spacing Z between adjacent lines 25 is less than or equal to the width X of those lines.

$$Y \geq X \text{ and } X \geq Z$$

This becomes particularly useful when fabricating a high resolution circuit pattern where there are long runs of fine lines adjacent to one another, such as in a situation where many lines are bussed out in a confined area of the printed circuit board (PCB). If a positive acting resist such as the AZ4620 is used, the regions 30 which are unexposed to light will remain polymerized, and the regions 25 which are exposed will unpolymerize. On the other hand, if a negative acting material such as Riston™ is used, the exposed regions 30 polymerize. In either case, after exposure, the unpolymerized regions of the film are removed in a developing step. This process, known to those skilled in the art as photodelineation, produces a pattern in the photopolymer layer 20 which reveals portions 45 of the underlying PVA layer 10. During removal of the photopolymer, it is possible that some or all of the revealed portions 45 of the underlying polymeric layer 10 may be removed.

Figure 3:
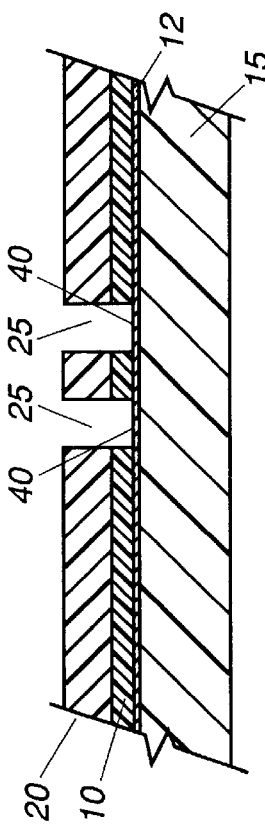
FIG. 3 is a cross-sectional view of the substrate shown in FIG. 2 after removing the exposed portions of the first polymer layer, in accordance with the invention.

After developing, to fully remove the revealed portions 45 of the underlying polymeric layer 10, the substrate is rinsed in a hot aqueous solution. The hot aqueous solution is preferably water heated to about 30° C., or any number of conventional preplate alkaline or acid microetch cleaners can be used, such as Circuitprep 150 manufactured by Enthone OMI Corporation. Alternatively, the revealed PVA portions 45 may be removed by using a technique commonly referred to as plasma ashing where the substrate is exposed to an oxygen based plasma and the polymer converted to gaseous species such as carbon monoxide. In any case, after removing both layers of material, the patterned substrate now has the appearance shown in FIG. 3, where the pattern 40 now extends completely through bilayer film structure and down to the substrate surface. If the substrate has a metal seed layer 12, then portions of the layer 12 now lie exposed and ready to be plated up. Prior to plating, the entire structure is baked at 100° C. or higher to enhance the adhesion between the two polymer layers 10, 20.

Figure 4:
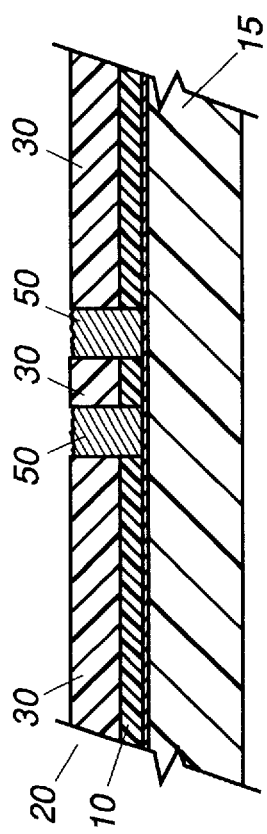
FIG. 4 is a cross-sectional view of the substrate shown in FIG. 3 after plating metal in the photodelineated pattern, in accordance with the invention.
Figure 5:
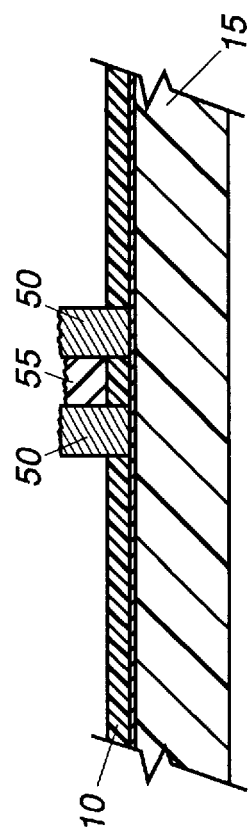
FIG. 5 is a cross-sectional view of the substrate shown in FIG. 4 after stripping away the photosensitive polymer layer, in accordance with the invention.
Figure 6:
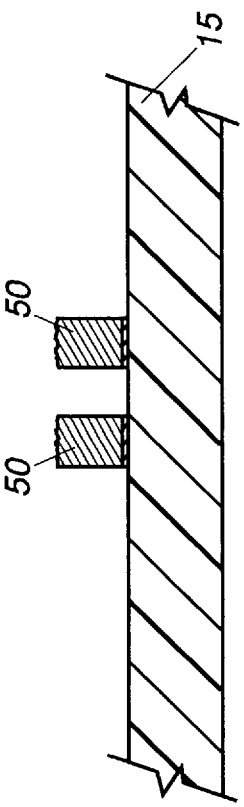
FIG. 6 is a cross-sectional view of the substrate shown in FIG. 5 after stripping away the underlying polymer layer, in accordance with the invention.

Referring to FIG. 4, the metal pattern 50 is then formed on the substrate surface. One such means of forming the metal pattern 50 is by electroplating. When plating is complete, the metal pattern typically has a thickness that approximates the thickness of the photopolymer layer 20. The remaining portions 30 of the photopolymer layer 20 are removed or stripped from the substrate using conventional stripping solutions such as hot alkaline solution containing sodium or potassium hydroxide (>1wt %) or monoethanolamine. During the stripping process, nearly all portions of the photopolymer layer 20 are removed except for the resist 55 that is trapped between those metal patterns 50 that are closely spaced, as shown in FIG. 5. These trapped resist portions 55 are now easily removed by dissolving the underlying PVA layer 10 in a hot aqueous solution. Due to its high solubility in hot aqueous solutions, the PVA layer readily dissolves, carrying with it the overlying trapped resist 55. This process lifts the remaining resist off of the substrate, leaving a clean substrate with only the plated metal pattern 50 remaining, as shown in FIG. 6. As described in the following examples, the instant invention has been used to successfully form 0.8 mm line and space features that were 0.8 mm thick using 0.8 mm thick photoresist and semiadditive electroplating processes.

CONTROL EXAMPLE

Alumina ceramic substrates were coated on one surface with 600 Å of chrome and 3000 Å of copper by the technique of sputter deposition. After the metals were deposited, a layer of photoresist was laminated at 105° C. and 0.5 meter/min with RISTON™ 4720 dry film photoresist (DuPont Corporation). The photoresist was imaged through a phototool which had high resolution 0.8 mm line and space features in hard contact at 70 millijoules/sq. cm. and subsequently baked at 115° C. for 10 minutes. After cooling to room temperature the resist was developed in a dilute aqueous solution of 0.75 wt % sodium carbonate removing the unexposed features in the photoresist. After drying, the substrate containing the patterned dry film photoresist was baked in a convection oven at 125° C. for 30 minutes.

Upon removal from the oven, the exposed regions were cleaned by dipping in a preplate cleaning solution comprising 15% Circuitprep 150 (Enthone OMI Corporation), and then rinsed. The clean, patterned substrate was then electroplated with copper using a bright acid copper bath, and with gold using a potassium cyanide-based gold plating bath. These plating solutions are also manufactured by Enthone OMI and are sold under the names CuBath XL and Pur-A-Gold 125 respectively. After electroplating, the photoresist was stripped in an aqueous solution of 10% monoethanolamine for 2 minutes at 60° C. Upon removal from this solution, the substrate was inspected and residual photoresist was found between the closely spaced plated traces.

EXPERIMENTAL EXAMPLE

Alumina ceramic substrates were coated on one surface with 600 Å of chrome and 3000 Å of copper by the technique of sputter deposition. After the metals were deposited, a polyvinyl alcohol solution known as EMULSITONE™ (Emulsitone Corporation) was spin coated on the metallized surface of the substrate at 4000 RPM for 30 seconds and subsequently dried in a convection oven at 80° C. for 30 minutes. The dried thickness of the polyvinyl alcohol layer was approximately 1 micron. After drying, the coated side of the substrate was laminated at 105° C. and 0.5 meter/min with RISTON™ 4720 dry film photoresist (DuPont Corporation). The photoresist was imaged through a phototool which had high resolution 0.8 mm line and space features, in hard contact with the photoresist, at 70 millijoules/sq. cm. and subsequently baked at 115° C. for 10 minutes. After cooling to room temperature the resist was developed in a dilute aqueous solution of 0.75 wt % sodium carbonate removing the unexposed features in the photoresist. The substrate was subsequently rinsed in 50° C. water for 10 seconds to remove the exposed polyvinyl alcohol layer, immersed in deionized water for final rinse and then dried. After drying, the substrate and composite film structure were baked in a convection oven at 125° C. for 30 minutes.

Upon removal from the oven, the exposed regions were cleaned by dipping in a preplate cleaning solution comprising 15% Circuitprep 150 (Enthone OMI Corporation), and then rinsed. The clean, patterned substrate was then electroplated with copper using a bright acid copper bath, and with gold using a potassium cyanide-based gold plating bath. These plating solutions are also manufactured by Enthone OMI and are sold under the names CuBath XL and Pur-A-Gold 125 respectively. After electroplating, the photoresist was stripped in an aqueous solution of 10% monoethanolamine for 2 minutes at 60° C. Upon removal from this solution, the substrates were inspected with no residual photoresist seen between the plated traces.

When comparing the control example to the experimental example, the substrates that had only the photoresist layer and not the polyvinyl alcohol layer had residual photoresist between the plated traces. In fact, stripping the photoresist on the control substrates three times as long still did not completely removed all the material. Both groups of substrates then had the exposed sputtered copper and chrome layers etched in acid solutions. Upon further inspection, the groups which had the composite PVA photoresist structure had no sputtered metal remaining between the traces, but the control group did, because the residual photoresist prevented the underlying sputtered seed metal from completely etching. This created electrical shorts in the control substrates, while the experimental group with the polyvinyl alcohol were defect free.

In summary, a method of creating high resolution metal circuitry on substrates has been devised. The method produces PCBs that have closely spaced conductors of significant thickness without the usual condition of shorting between conductors. The use of a temporary layer of PVA underlying the photoresist, which has heretofore been unknown, aids in removing the very small portions of resist that remain after plating. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming high resolution circuitry, comprising:
    depositing a thin polyvinyl alcohol layer on a substrate;
    depositing a photosensitive polymer layer on top of the thin polyvinyl alcohol layer;
    photodelineating a pattern in the deposited photosensitive polymer layer to reveal portions of the thin polyvinyl alcohol layer;
    rinsing the revealed portions in a first hot aqueous solution to effect removal of the revealed portions, thereby exposing portions of the substrate;
    electroplating metal into the photodelineated pattern and onto the exposed portions of the substrate to create a circuitry pattern; and
    removing the remaining portions of the photosensitive polymer layer and the thin polyvinyl alcohol layer by means of a second hot aqueous solution.

2. The method of claim 1, wherein the first hot aqueous solution comprises water or preplate microetch cleaners.

3. The method of claim 1, wherein the second hot aqueous solution comprises an alkaline solution.

4. The method of claim 1, wherein the substrate has a metal seed layer overlying the substrate surface.

5. The method of claim 1, wherein the step of depositing a thin layer of polyvinyl alcohol further comprises drying the thin polyvinyl alcohol layer at 50°–100° C. after depositing.

6. The method of claim 1, further comprising a step, between the step of rinsing and the step of electroplating, of baking at 100°–140° C.

7. The method of claim 1, wherein the step of photodelineating a pattern comprises exposing portions of the photosensitive polymer layer to actinic light and developing photosensitive polymer layer in an alkaline solution.

8. The method of claim 1, wherein a portion of the pattern comprises a cross sectional structure having a height equal to or greater than a width.

9. The method of claim 1, wherein spacing between adjacent traces in the circuitry pattern is equal to or less than the width of the traces.

10. A method of forming high resolution metal circuitry on a substrate, comprising:
    providing a substrate having a metal seed layer overlying a major surface;
    depositing a thin polyvinyl alcohol layer on a substrate;
    drying the thin polyvinyl alcohol layer at 50°–100° C.;
    depositing a photosensitive polymer layer on top of the thin polyvinyl alcohol layer;
    exposing portions of the photosensitive polymer layer to actinic light and then developing the photosensitive polymer layer in an alkaline solution in order to photodelineate a pattern in the photosensitive polymer layer, so as to reveal portions of the underlying thin polyvinyl alcohol layer;
    rinsing the revealed portions in a heated water or preplate microetch solution to effect removal of the revealed portions, thereby exposing portions of the substrate;
    baking at 100°–140° C.;
    electroplating metal into the photodelineated pattern and onto the exposed portions of the substrate to create a circuitry pattern; and
    removing the remaining portions of the photosensitive polymer layer and the thin polyvinyl alcohol layer by immersing in a heated alkaline solution.

11. The method of claim 10, wherein a portion of the pattern comprises a cross sectional structure having a height equal to or greater than a width.

12. The method of claim 10, wherein spacing between adjacent traces in the circuitry pattern is equal to or less than the width of the traces.

* * * * *